United States Patent
Sun et al.

(10) Patent No.: US 12,203,020 B2
(45) Date of Patent: Jan. 21, 2025

(54) COLOR FILM SUBSTRATE, FABRICATION METHOD THEREFOR AND DISPLAY DEVICE

(71) Applicant: BOE Technology Group Co., Ltd., Beijing (CN)

(72) Inventors: Qian Sun, Beijing (CN); Qian Jin, Beijing (CN); Tianhao Lu, Beijing (CN); Wei Huang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 218 days.

(21) Appl. No.: 17/921,069

(22) PCT Filed: May 8, 2021

(86) PCT No.: PCT/CN2021/092353
§ 371 (c)(1),
(2) Date: Oct. 24, 2022

(87) PCT Pub. No.: WO2021/249075
PCT Pub. Date: Dec. 16, 2021

(65) Prior Publication Data
US 2023/0174857 A1    Jun. 8, 2023

(30) Foreign Application Priority Data

Jun. 10, 2020 (CN) .................. 2020105251111.X

(51) Int. Cl.
*C09K 11/77* (2006.01)
*G02F 1/1335* (2006.01)
(Continued)

(52) U.S. Cl.
CPC .... *C09K 11/7713* (2013.01); *G02F 1/133504* (2013.01); *G02F 1/133512* (2013.01);
(Continued)

(58) Field of Classification Search
CPC .......... G02F 1/133514; G02F 1/01791; H10K 59/38; H01L 51/502; H01L 31/035218
See application file for complete search history.

(56) References Cited

U.S. PATENT DOCUMENTS

| 2018/0045866 A1 | 2/2018 | Chae et al. |
| 2018/0203292 A1 | 7/2018 | Kim et al. |
(Continued)

FOREIGN PATENT DOCUMENTS

| CN | 107728368 A | 2/2018 |
| CN | 108267883 A | 7/2018 |
(Continued)

OTHER PUBLICATIONS

PCT/CN2021/092353 international search report.

*Primary Examiner* — Mariam Qureshi
(74) *Attorney, Agent, or Firm* — IPro, PLLC

(57) ABSTRACT

A color film substrate, a fabrication method therefor, and a display device. The color film substrate comprises a base substrate (1); a black matrix (2) is located on one side of the base substrate (1), the black matrix (2) having a plurality of pixel openings (21); a quantum dot color film layer (31, 32, 33) is located in the pixel openings (21) and comprises an ultraviolet light-curable quantum dot material; and a light conversion structure (4), which is located between a side wall of the black matrix (2) and a side wall of the quantum dot color film layer (31, 32, 33). When a quantum dot solution is UV cured, the light conversion structure (4) may convert ultraviolet light of 395 nm into ultraviolet light that has a shorter wavelength and higher energy. Since the light conversion structure (4) is arranged between the side wall of the black matrix (2) and the side wall of the quantum dot color film layer (31, 32, 33), the ultraviolet light that has a shorter wavelength and higher energy may be emitted from a side edge and irradiated to the quantum dot color film layer (Continued)

(31, 32, 33), which solves the problem of uneven UV curing of the quantum dot color film layer (31, 32, 33), thereby improving the light-emitting performance of the display device.

15 Claims, 6 Drawing Sheets

(51) Int. Cl.
*G02F 1/13357* (2006.01)
*G03F 7/00* (2006.01)
*H01L 33/50* (2010.01)
*H10K 59/80* (2023.01)
*H01L 25/16* (2023.01)
*H10K 59/12* (2023.01)

(52) U.S. Cl.
CPC ...... *G02F 1/133617* (2013.01); *G03F 7/0007* (2013.01); *H01L 33/507* (2013.01); *H10K 59/8792* (2023.02); *G02F 2202/36* (2013.01); *H01L 25/167* (2013.01); *H10K 59/12* (2023.02)

(56) References Cited

U.S. PATENT DOCUMENTS

| | | | |
|---|---|---|---|
| 2019/0079341 A1 | 3/2019 | Lee | |
| 2020/0073167 A1 | 3/2020 | Shi et al. | |
| 2020/0075816 A1 | 3/2020 | Cheng et al. | |
| 2021/0341653 A1* | 11/2021 | Wang | H01L 33/50 |
| 2024/0021158 A1* | 1/2024 | Choi | G09G 3/3233 |
| 2024/0268153 A1* | 8/2024 | Lee | H10K 59/40 |

FOREIGN PATENT DOCUMENTS

| | | |
|---|---|---|
| CN | 108873465 A | 11/2018 |
| CN | 109491127 A | 3/2019 |
| CN | 109765728 A | 5/2019 |
| CN | 110441956 A | 11/2019 |
| CN | 111580301 A | 8/2020 |

\* cited by examiner

COLOR FILM SUBSTRATE, FABRICATION METHOD THEREFOR AND DISPLAY DEVICE

CROSS REFERENCE TO RELATED APPLICATIONS

The application is a US National Stage of International Application No. PCT/CN2021/092353, filed on May 8, 2021, which claims priority from Chinese Patent Application No. 202010525111.X, entitled "COLOR FILM SUBSTRATE, FABRICATION METHOD THEREFOR AND DISPLAY DEVICE", filed with the China National Intellectual Property Administration on Jun. 10, 2020, which is hereby incorporated by reference in its entirety.

TECHNICAL FIELD

The disclosure relates to the technical field of display, in particular to a color film substrate, a fabrication method therefor and a display apparatus.

BACKGROUND

With continuous development of the display technology, higher requirements for the display quality of display apparatuses have been proposed. As a novel light emitting material, a quantum dot material has the advantages of concentrated luminescent spectrum, high color purity and simple adjustment in luminous colors through a size, structure or composition of the quantum dot material.

SUMMARY

An embodiment of the disclosure provides a color film substrate, including: a base substrate; a black matrix, disposed on one side of the base substrate, and having a plurality of pixel openings; a quantum dot color film layer, located in the pixel openings, and including an ultraviolet curable quantum dot material; and a light conversion structure, located between a side wall of the black matrix in the plurality of openings and a side wall of the quantum dot color film layer, and configured to convert ultraviolet light of a first wavelength into ultraviolet light of a second wavelength, wherein the first wavelength is greater than the second wavelength.

In some embodiments, in the above color film substrate provided by the embodiment of the disclosure, the first wavelength is less than 400 nm.

In some embodiments, in the above color film substrate provided by the embodiment of the disclosure, a cross section of the light conversion structure in a direction parallel to a surface of the base substrate has a preset width, and in a direction from a surface of the light conversion structure away from the base substrate to a surface close to the base substrate, the preset width is the same.

In some embodiments, in the above color film substrate provided by the embodiment of the disclosure, a cross section of the light conversion structure in a direction parallel to a surface of the base substrate has a preset width, and in a direction from a surface of the light conversion structure away from the base substrate to a surface close to the base substrate, the preset width is gradually increased.

In some embodiments, in the above color film substrate provided by the embodiment of the disclosure, in a direction parallel to a surface of the base substrate, a width of a surface of the black matrix away from the base substrate is less than a width of a surface close to the base substrate.

In some embodiments, in the above color film substrate provided by the embodiment of the disclosure, the light conversion structure includes scattering particles.

In some embodiments, in the above color film substrate provided by the embodiment of the disclosure, the light conversion structure includes a base body, and an upconversion luminescent material doped in the base body; a material of the base body is photoresist; and the upconversion luminescent material includes one or a combination of Sc-sulfate, Y-sulfate, La-sulfate, Gd-sulfate or Lu-sulfate, and an activator.

In some embodiments, in the above color film substrate provided by the embodiment of the disclosure, the activator includes one or a combination of $Bi^{3+}$, $Pr^{3+}$ or $Nd^{3+}$, and a mass of the activator accounts for 0.1%-10% of a mass of the upconversion luminescent material.

Accordingly, an embodiment of the disclosure further provides a display apparatus, including: a display substrate, and a color film substrate disposed on a light emitting side of the display substrate, and the color film substrate is the above color film substrate provided by the embodiment of the disclosure.

In some embodiments, in the above display apparatus provided by the embodiment of the disclosure, the display substrate includes a reflective layer, a backlight module, a protective layer, a first polarizer, a drive substrate, a liquid crystal layer, a second polarizer and an encapsulation layer arranged sequentially in a stacked manner, and the encapsulation layer is in contact with the black matrix, the quantum dot color film layer and the light conversion structure.

In some embodiments, in the above display apparatus provided by the embodiment of the disclosure, the display substrate includes a drive substrate, a plurality of mini-LEDs located on the drive substrate, a planarization layer located on one side of the mini-LEDs facing away from the drive substrate, and an encapsulation layer located on one side of the planarization layer facing away from the drive substrate, and the encapsulation layer is in contact with the black matrix, the quantum dot color film layer and the light conversion structure.

In some embodiments, in the above display apparatus provided by the embodiment of the disclosure, the display substrate includes a drive substrate, an anode, an organic light emitting layer, a cathode and an encapsulation layer arranged sequentially in a stacked manner, and the encapsulation layer is in contact with a black matrix, a quantum dot color film layer and a light conversion structure.

Accordingly, an embodiment of the disclosure further provides a fabrication method of the above color film substrate provided by the embodiment of the disclosure, including:

forming the black matrix having the plurality of pixel openings on the base substrate;

forming the light conversion structure attached to the side wall of the black matrix in the pixel openings;

performing spin coating or ink-jet printing of the quantum dot mixed solution including an ultraviolet curable quantum dot material in the pixel openings having the light conversion structure; and forming the quantum dot color film layer by performing ultraviolet light irradiation on the quantum dot mixed solution adopting ultraviolet light of the first wavelength.

In some embodiments, in the above fabrication method provided by the embodiment of the disclosure, ultraviolet light of the first wavelength less than 400 nm is adopted to perform ultraviolet light irradiation on the quantum dot mixed solution.

In some embodiments, in the above fabrication method provided by the embodiment of the disclosure, the forming the light conversion structure attached to the side wall of the black matrix in the pixel openings, includes: coating a photoresist doped with an upconversion luminescent material on a side of the black matrix facing away from the base substrate; and performing exposure and development on the photoresist, to form the light conversion structure attached to the side walls of the pixel openings.

DETAILED DESCRIPTION

In order to make the objects, the technical solutions and the advantages of the disclosure clearer, the specific implementations of a color film substrate, a fabrication method therefor and a display apparatus provided by embodiments of the disclosure will be described in detail below in conjunction with the accompanying drawings.

Thicknesses and shapes of all film layers in the accompanying drawings do not reflect a true scale of the color film substrate, and are only intended to schematically illustrate the contents of the disclosure.

As a new generation of light emitting materials used in solid-state lighting and full-color flat panel display, after solution processing, spin coating or ink-jet printing, quantum dot ink is further cured into a film to form a quantum dot color film.

At present, the film thickness required for fabricating a quantum dot color film layer with quantum dot ink is relatively large, which requires a higher performance of the curing of the quantum dot ink. The inventors of this application find that when UV-curable quantum dot ink is cured, ink on a surface layer would have been cured, while ink on a lower layer is not completely cured due to insufficient UV irradiation, resulting in uneven curing of the quantum dot color film layer and affecting the light-emitting performance.

Figure 1:
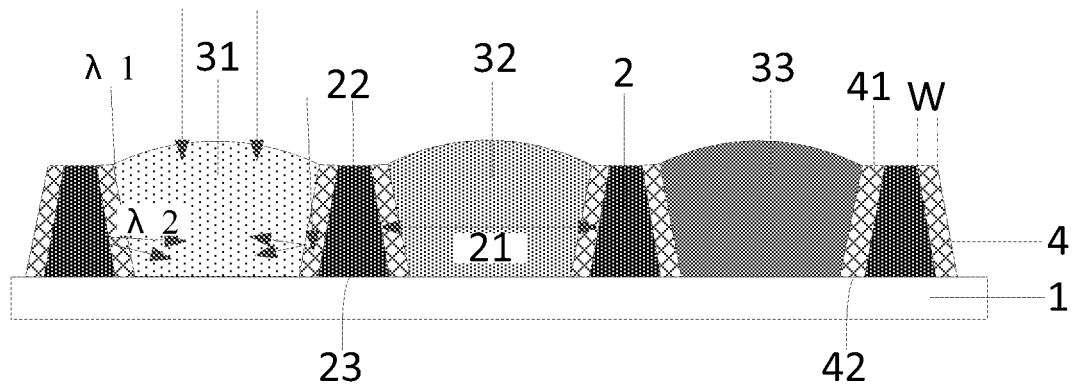
FIG. 1 is a schematic structural diagram of a color film substrate provided by an embodiment of the disclosure.
Figure 2:
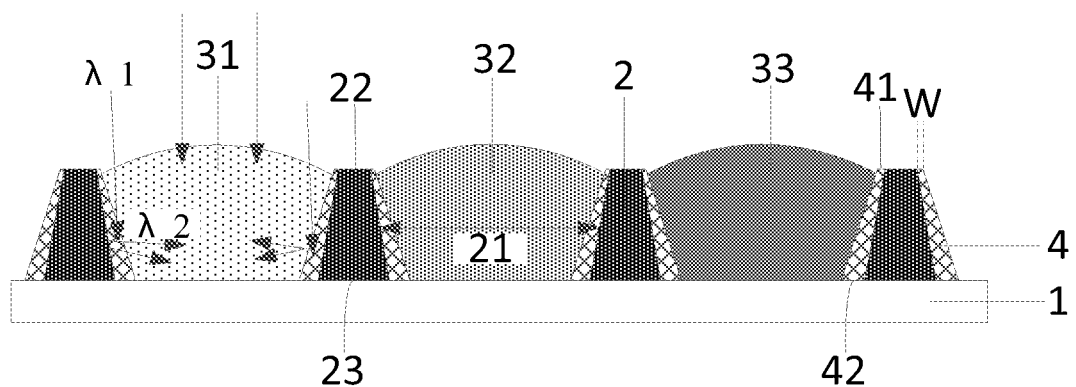
FIG. 2 is another schematic structural diagram of a color film substrate provided by an embodiment of the disclosure.

In order to solve the above problem, an embodiment of the disclosure provides a color film substrate, as shown in FIG. 1 and FIG. 2, including:
- a base substrate 1;
- a black matrix 2, disposed on a side of the base substrate 1, and having a plurality of pixel openings 21;
- a quantum dot color film layer (such as a red quantum dot color film layer 31, a green quantum dot color film layer 32 and a blue quantum dot color film layer 33), disposed in the pixel openings 21, and including an ultraviolet curable quantum dot material; and
- a light conversion structure 4, located between a side wall of the black matrix 2 and a side wall of the quantum dot color film layer, and configured to convert ultraviolet light of a first wavelength $\lambda 1$ into ultraviolet light of a second wavelength $\lambda 2$, and the first wavelength $\lambda 1$ is greater than the second wavelength $\lambda 2$.

According to the above color film substrate provided by the embodiment of the disclosure, since the quantum dot color film layer is generally formed after solution processing, spin coating or ink-jet printing, and UV curing into a film, the light conversion structure is arranged between the side wall of the black matrix and the side wall of the quantum dot color film layer, when UV curing (ultraviolet light irradiation, such as ultraviolet light of 395 nm) is performed on the quantum dot solution, the light conversion structure may convert the ultraviolet light of 395 nm into ultraviolet light that has a shorter wavelength and higher energy (such as 365 nm). Since the light conversion structure is arranged between the side wall of the black matrix and the side wall of the quantum dot color film layer, the ultraviolet light that has the shorter wavelength and higher energy may be emitted from a side edge of the quantum dot color film layer and irradiated to the quantum dot color film layer, and the situation that the quantum dot color film layer is not completely cured due to insufficient UV irradiation, resulting in uneven curing of the quantum dot color film layer is prevented. In the embodiment of the disclosure, the light conversion structure is arranged between the side wall of the black matrix and the side wall of the quantum dot color film layer, the quantum dot color film layer can be cured more fully, the problem of uneven UV curing of the quantum dot color film layer is solved, and thus the light-emitting performance of a display device is improved.

In some embodiments, the above ultraviolet curable quantum dot material includes a quantum dot, an ultraviolet light initiator and an ultraviolet light curing material. The ultraviolet curable quantum dot material may be cured under irradiation of the ultraviolet light of the first wavelength and the ultraviolet light of the second wavelength, and the light conversion structure may convert the absorbed ultraviolet light of the first wavelength into the ultraviolet light of the second wavelength shorter than the first wavelength.

In some embodiments, the base substrate may be a glass base substrate.

In some embodiments, most of existing light emitting devices adopt primary colors red, green and blue to mix and emit white light, while the color film substrate of the disclosure is provided with the light conversion structure that can convert the absorbed ultraviolet light into the ultraviolet light of a shorter wavelength. In order to prevent the light conversion structure from absorbing the light of the primary colors red, green and blue in the light emitting process, in the above color film substrate provided by the embodiment of the disclosure, the first wavelength is less than 400 nm, that is, the light conversion structure can only absorb light of a wavelength less than 400 nm. Therefore, in the solution provided by the embodiment of the disclosure, the uniformity of UV curing of the quantum dot color film layer can be improved on the basis of not affecting light emitting.

In some embodiments, in the above color film substrate provided by the embodiment of the disclosure, as shown in FIG. 1, a cross section of the light conversion structure 4 in a direction parallel to a surface of the base substrate 1 has a preset width W, and in a direction from a surface 41 of the light conversion structure 4 away from the base substrate 1 to a surface 42 close to the base substrate, the preset width W is the same.

In some embodiments, since the quantum dot color film layer on one side close to the base substrate is not completely cured compared with the quantum dot color film layer on one side away from the base substrate, in order to enable the quantum dot color film layer on the side close to the base substrate to be completely cured, the quantum dot color film layer on the side close to the base substrate needs to be irradiated with more converted UV light. Based on this, in the above color film substrate provided by the embodiment of the disclosure, as shown in FIG. 2, a cross section of the light conversion structure 4 in a direction parallel to a surface of the base substrate 1 has a preset width W, and in a direction from a surface 41 of the light conversion structure 4 away from the base substrate 1 to a surface 42 close to the base substrate, the preset width W may be gradually increased. In this way, the light conversion structure 4 on the side close to the base substrate may convert more UV light, the quantum dot color film layer on the side close to the base substrate may be irradiated with more UV light that has a shorter wavelength and higher energy, and thus the uniformity of UV curing of the quantum dot color film layer is further improved.

In some embodiments, in order to ensure that more ultraviolet light of the first wavelength is converted into the ultraviolet light of the second wavelength, in the color film substrate provided by the embodiment of the disclosure, as shown in FIG. 1 and FIG. 2, in a direction perpendicular to a thickness of the base substrate 1, a width of a surface 22 of the black matrix 2 away from the base substrate 1 is less than a width of a surface 23 close to the base substrate 1, that is, a cross section of the black matrix 2 along a surface perpendicular to the base substrate is of a regular trapezoidal structure, which can form a light conversion structure 4 with a greater area. Therefore, more ultraviolet light of the first wavelength may be converted into the ultraviolet light of the second wavelength, and the uniformity of UV curing of the quantum dot color film layer is further improved.

In some embodiments, in the above color film substrate provided by the embodiment of the disclosure, as shown in FIG. 1 and FIG. 2, the light conversion structure 4 may internally has scattering particles. In some embodiments, the scattering particles are doped in the light conversion structure 4, so that scattering of the UV light may be realized by the scattering particles, so as to enhance light emitting uniformity, and the uniformity of UV curing of the quantum dot color film layer may be realized more effectively.

In some embodiments, in the above color film substrate provided by the embodiment of the disclosure, the light conversion structure may include a base body, and an upconversion luminescent material doped in the base body. In some embodiments, the upconversion luminescent material is a material that can absorb two or more photons with a low energy while emit one photon with a high energy, that is, a wavelength of absorbed light is greater than a wavelength of emitted light. In addition, the upconversion luminescent material is granular and has a scattering effect, so the light after wavelength conversion is scattered light in all directions, which can improve the uniformity of UV curing of the quantum dot color film layer.

In some embodiments, in the color film substrate provided by the embodiment of the disclosure, a material of the base body may be photoresist, the upconversion luminescent material may include one or a combination of Sc-sulfate, Y-sulfate, La-sulfate, Gd-sulfate and Lu-sulfate, and an activator. In this way, the upconversion luminescent material may be doped in the photoresist, so as to form the light conversion structure in the disclosure through a process of exposure and development.

In some embodiments, in the above color film substrate provided by the embodiment of the disclosure, the activator may include one or a combination of $Bi^{3+}$, $Pr^{3+}$ or $Nd^{3+}$.

In some embodiments, in order to ensure that the light conversion structure can effectively convert the absorbed light of the first wavelength into the light of the second wavelength, in the color film substrate provided by the embodiment of the disclosure, a mass of the activator may account for 0.1%-10% of a mass of the upconversion luminescent material, which is not limited in the disclosure.

Figure 3:
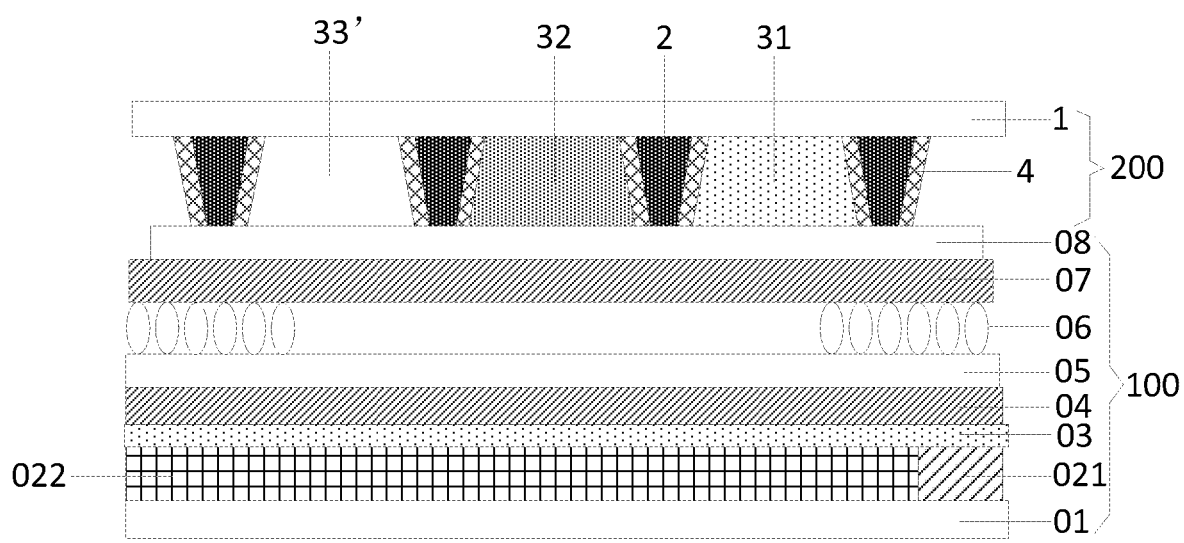
FIG. 3 is a schematic structural diagram of a display apparatus provided by an embodiment of the disclosure.
Figure 4:
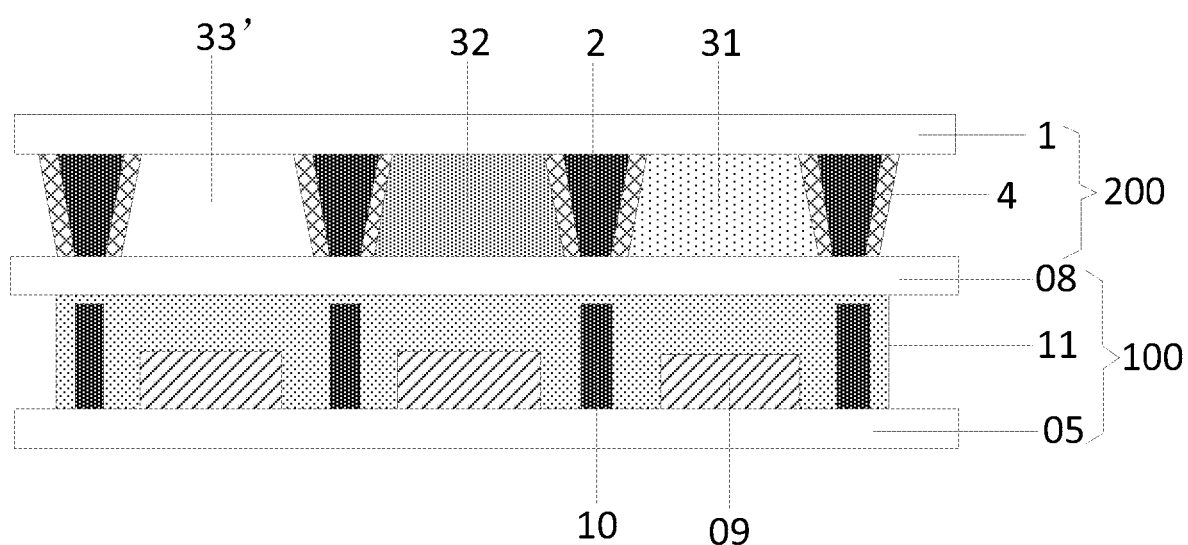
FIG. 4 is another schematic structural diagram of a display apparatus provided by an embodiment of the disclosure.
Figure 5:
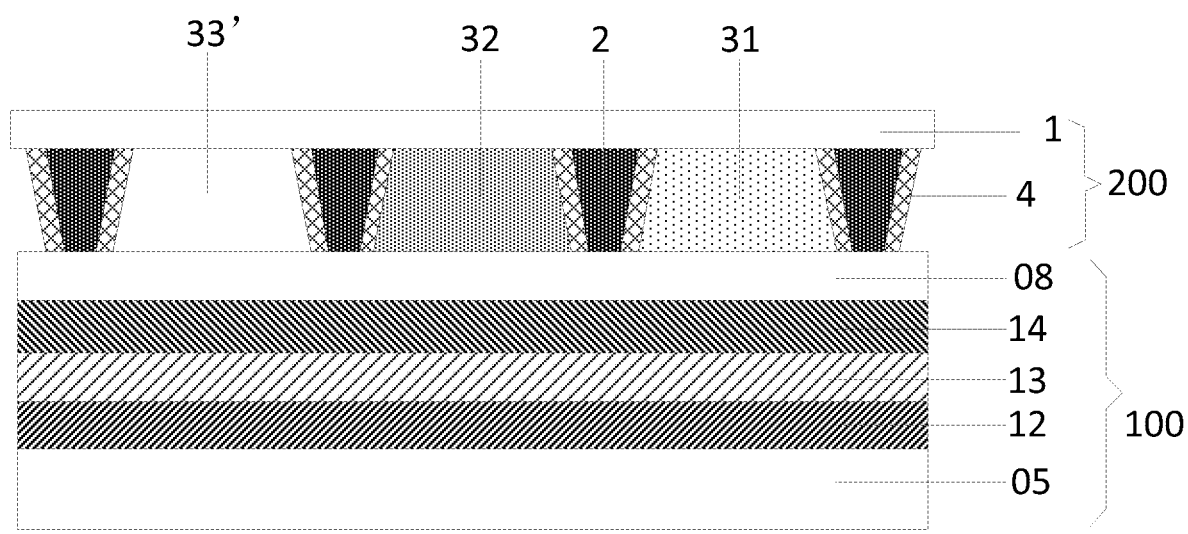
FIG. 5 is yet another schematic structural diagram of a display apparatus provided by an embodiment of the disclosure.

Based on the same inventive concept, an embodiment of the disclosure further provides a display apparatus, as shown in FIG. 3 to FIG. 5, including: a display substrate 100, and a color film substrate 200 disposed on a light emitting side of the display substrate 100, and the color film substrate 200 is the above color film substrate provided by the embodiment of the disclosure.

In some embodiments, in the display apparatus provided by the embodiment of the disclosure, as shown in FIG. 3, the display substrate 100 may include a reflective layer 01, a backlight module, a protective layer 03, a first polarizer 04, a drive substrate 05, a liquid crystal layer 06, a second polarizer 07 and an encapsulation layer 08 disposed sequentially in a stacked manner, and the encapsulation layer 08 is in contact with a black matrix 2, a quantum dot color film layer and a light conversion structure 4.

In some embodiments, the display apparatus shown in FIG. 3 is a liquid crystal display apparatus, the backlight module is of a side entry type, and the backlight module includes a backlight source 021 and a light guide plate 022 disposed on a light emitting side of the backlight source 021. The backlight source 021 is an LED chip emitting blue light, so that a blue quantum dot color film layer 33 does not need to be arranged in the quantum dot color film layer, but a position where the blue quantum dot color film layer 33 is to be arranged is filled with a scattering material to form a scattering layer 33', which can ensure the light emitting uniformity of the quantum dot color film layer.

It should be noted that, FIG. 3 is one of liquid crystal display apparatus structures listed by the embodiment of the disclosure, which adopt the quantum dot color film layer as a color film. Of course, it may further be other liquid crystal display apparatuses familiar to those skilled in the art, and as long as the color film substrate provided by the embodiment of the disclosure is adopted as the color film substrate, the problem of uneven UV curing of the quantum dot color film layer can be solved.

In some embodiments, in the display apparatus provided by the embodiment of the disclosure, as shown in FIG. 4, the display substrate 100 may include: a drive substrate 05, a plurality of mini-LEDs 09 located on the drive substrate 05, and a barrier dam 10 is arranged around the mini-LEDs 09 to prevent a phenomenon of light mixing, a planarization layer 11 disposed on a side of the mini-LEDs 09 facing away from the drive substrate 05, and an encapsulation layer 08 disposed on a side of the planarization layer 11 facing away from the drive substrate 05, and the encapsulation layer 08 is in contact with a black matrix 2, a quantum dot color film layer and a light conversion structure 4.

In some embodiments, as shown in FIG. 4, the mini-LEDs 09 are LED chips emitting blue light, a blue quantum dot color film layer 33 does not need to be arranged in the quantum dot color film layer, but a position where the blue quantum dot color film layer 33 is to be arranged is filled with a scattering material to form a scattering layer 33', which can ensure the light emitting uniformity of the quantum dot color film layer.

It should be noted that, FIG. 4 is a mini-LED display apparatus structure listed by the embodiment of the disclosure, which adopts the quantum dot color film layer as a color film, the color film substrate provided by the embodiment of the disclosure is adopted as the color film substrate, and thus the problem of uneven UV curing of the quantum dot color film layer can be solved.

In some embodiments, in the above display apparatus provided by the embodiment of the disclosure, as shown in FIG. 5, the display substrate 100 may include a drive substrate 05, an anode 12, an organic light emitting layer 13, a cathode 14 and an encapsulation layer 08 disposed sequentially in a stacked manner. The encapsulation layer 08 is in contact with a black matrix 2, a quantum dot color film layer and a light conversion structure 4.

In some embodiments, a material of the organic light emitting layer 13 is a material emitting blue light, so that a position where a blue quantum dot color film layer 33 is to be arranged is filled with a scattering material to form a scattering layer 33', which can ensure the light emitting uniformity of the quantum dot color film layer.

It should be noted that, FIG. 5 is an organic light emitting display apparatus structure listed by the embodiment of the disclosure, which adopts the quantum dot color film layer as a color film, the color film substrate provided by the embodiment of the disclosure is adopted as the color film substrate, and thus the problem of uneven UV curing of the quantum dot color film layer can be solved.

In some embodiments, as shown in FIG. 3 to FIG. 5, the drive substrate 05 includes a base glass and a drive circuit disposed on the base glass, and the drive circuit is configured for the drive of light emitting display. The encapsulation layer 08 may be TFE encapsulation, that is, may include an inorganic layer, an organic layer and an inorganic layer disposed alternately.

In some embodiments, the display apparatus shown in FIG. 3 to FIG. 5 provided by the embodiment of the disclosure may further include other functional film layers familiar to those skilled in the art, which will not be detailed here.

Figure 6:
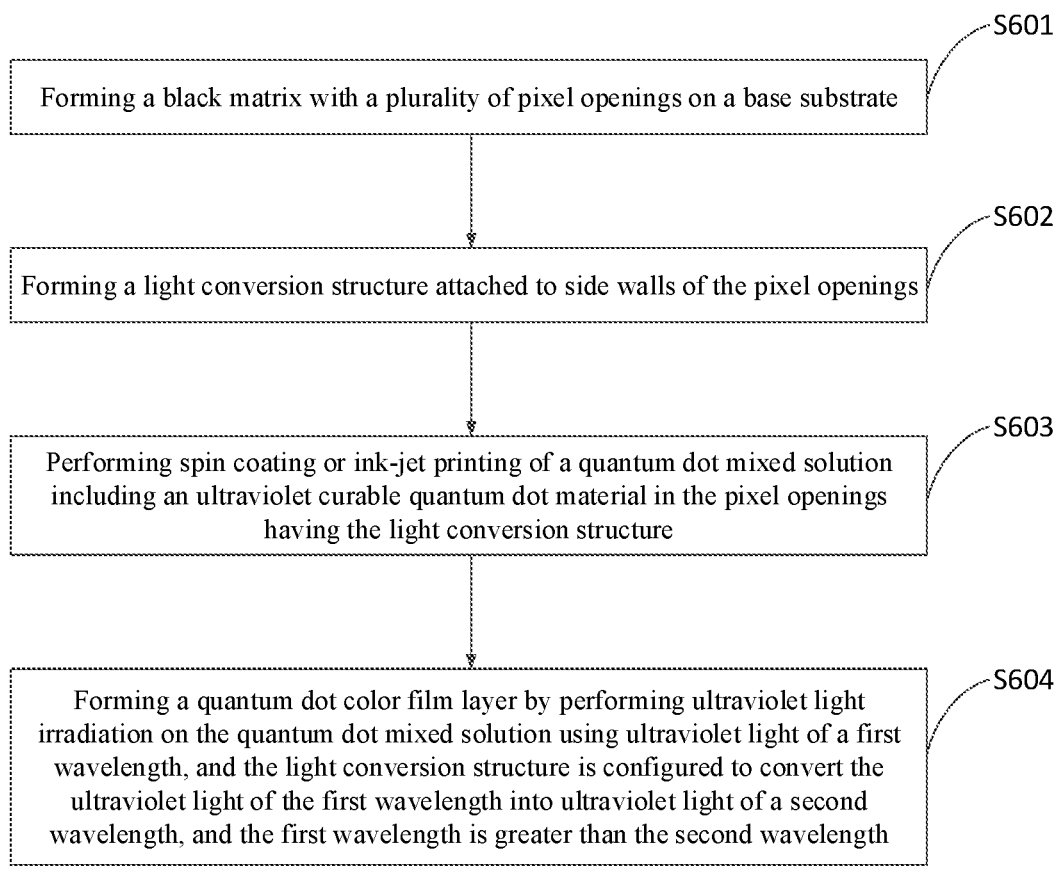
FIG. 6 is a flow chart of a fabrication method of a color film substrate provided by an embodiment of the disclosure.

Based on the same inventive concept, an embodiment of the disclosure further provides a fabrication method of the above color film substrate provided by the embodiment of the disclosure, and as shown in FIG. 6, the fabrication method may include:

S601, forming a black matrix with a plurality of pixel openings on a base substrate;

S602, forming a light conversion structure attached to side walls of the pixel openings;

S603, performing spin coating or ink-jet printing of a quantum dot mixed solution including an ultraviolet curable quantum dot material in the pixel openings having the light conversion structure; and S604, forming a quantum dot color film layer by performing ultraviolet light irradiation on the quantum dot mixed solution using ultraviolet light of a first wavelength, and the light conversion structure is configured to convert the ultraviolet light of the first wavelength into ultraviolet light of a second wavelength, and the first wavelength is greater than the second wavelength.

According to the fabrication method of the above color film substrate provided by the embodiment of the disclosure, the light conversion structure is formed between the side wall of the black matrix and the side wall of the quantum dot color film layer, and in this way, when UV curing (ultraviolet light irradiation, such as ultraviolet light of 395 nm) is performed on the quantum dot solution, the light conversion structure may convert the ultraviolet light of 395 nm into ultraviolet light that has a shorter wavelength and higher energy (such as 365 nm). Since the light conversion structure is arranged between the side wall of the black matrix and the side wall of the quantum dot color film layer, the ultraviolet light of the shorter wavelength and higher energy may be emitted from a side edge and irradiated to the quantum dot color film layer, and the situation that the quantum dot color film layer is not completely cured due to insufficient UV irradiation, resulting in uneven curing of the quantum dot color film layer is prevented.

In some embodiments, in order to prevent the light conversion structure from absorbing light of red, green and blue primary colors in the light emitting process, in the above fabrication method provided by the embodiment of the disclosure, ultraviolet light of the wavelength less than 400 nm is adopted to perform ultraviolet light irradiation on the quantum dot mixed solution.

Figure 7:
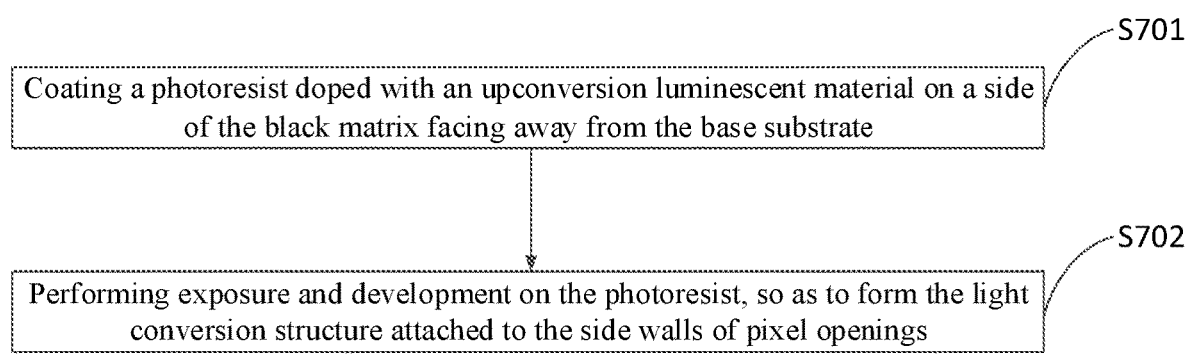
FIG. 7 is another flow chart of a fabrication method of a color film substrate provided by an embodiment of the disclosure.

In some embodiments, in the above fabrication method provided by the embodiment of the disclosure, the forming the light conversion structure attached to the side walls of the pixel openings, as shown in FIG. 7, may include:

S701, coating a photoresist doped with an upconversion luminescent material on a side of the black matrix facing away from the base substrate; and S702, performing exposure and development on the photoresist, so as to form the light conversion structure attached to the side walls of pixel openings.

Figure 8A:
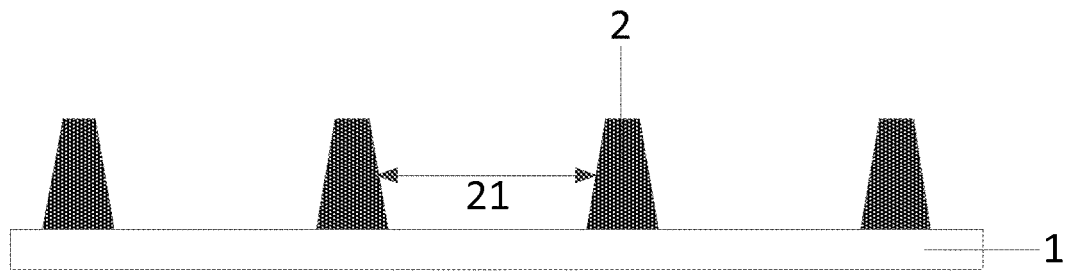
FIG. 8A to FIG. 8D are schematic structural diagrams of a fabrication method of a color film substrate provided by an embodiment of the disclosure after the respective steps are performed.
Figure 8B:
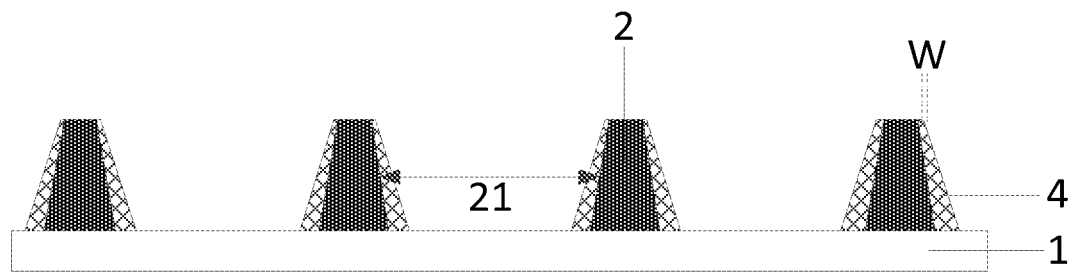
Figure 8C:
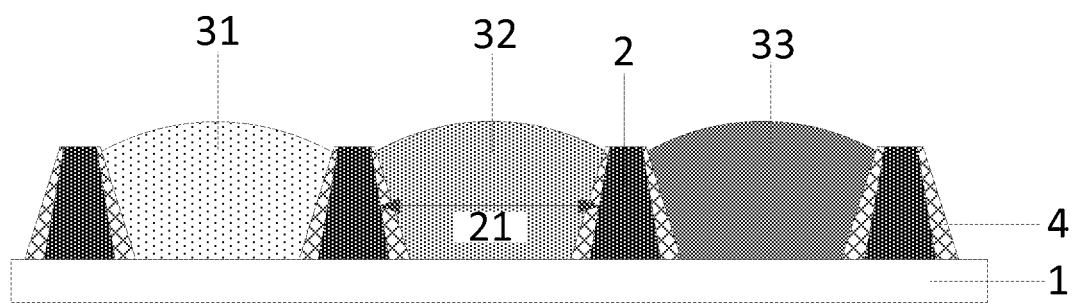
Figure 8D:
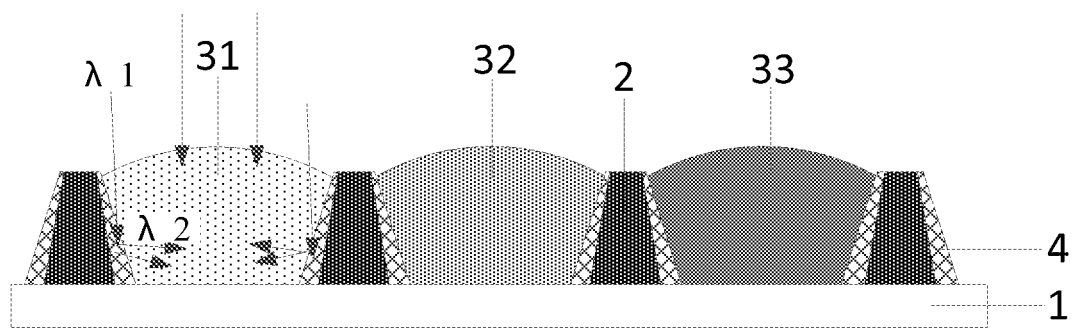

Taking the color film substrate shown in FIG. 2 as an example, the fabrication method of the color film substrate provided by the embodiment of the disclosure is described in detail below:

(1) the base substrate 1 is coated with a black matrix material, and exposure and development are performed on the black matrix material to form the black matrix 2 with the plurality of pixel openings 21, as shown in FIG. 8A;

(2) the base substrate 1 provided with the black matrix 2 is coated with the photoresist doped with the upconversion luminescent material, exposure and development are performed on the photoresist, and exposure amounts at different positions are controlled to form the light conversion structure 4 with the preset width W gradually increased, as shown in FIG. 8B;

(3) spin coating or ink-jet printing of the quantum dot mixed solution including the ultraviolet curable quantum dot material is performed in the pixel openings 21 provided with the light conversion structure 4, as shown in FIG. 8C; and (4) the ultraviolet light of the first wavelength $\lambda 1$ is adopted to perform ultraviolet light irradiation on the quantum dot mixed solution, and in the irradiation process, the light conversion structure 4 converts the ultraviolet light of the first wavelength λ1 into the ultraviolet light of the second wavelength λ2 less than the first wavelength λ1, so as to form a uniform cured quantum dot color film layer of different colors, as shown in FIG. 8D.

When forming a display apparatus using the color film substrate fabricated in the embodiment of the disclosure, a display substrate may be aligned and attached to the color film substrate in the embodiment of the disclosure to form the required display apparatus.

In some embodiments, the above display apparatus provided by the embodiment of the disclosure may be: a mobile phone, a tablet computer, a television, a display, a laptop, a digital photo frame, a navigator and any product or component with a display function. Other essential components of the touch color film substrate shall be understood by those of ordinary skill in the art, and are omitted herein and also shall not become a restriction to the disclosure. Implementation of the color film substrate may refer to the embodiment of the above color film substrate, and repetitions will not be made.

According to color film substrate, the fabrication method therefor and the display apparatus provided by the embodiments of the disclosure, since the quantum dot color film layer is generally formed after solution processing, spin coating or ink-jet printing, and UV curing into a film, the light conversion structure is arranged between the side wall of the black matrix and the side wall of the quantum dot color film layer, and when UV curing (ultraviolet light irradiation, such as ultraviolet light of 395 nm) is performed on the quantum dot solution, the light conversion structure may convert the ultraviolet light of 395 nm into ultraviolet light that has a shorter wavelength and higher energy (such as 365 nm). Since the light conversion structure is arranged between the side wall of the black matrix and the side wall of the quantum dot color film layer, the ultraviolet light of the shorter wavelength and higher energy may be emitted from the side edge of the quantum dot color film and irradiated to the quantum dot color film layer, and the situation that the quantum dot color film layer is not completely cured due to insufficient UV irradiation, resulting in uneven curing of the quantum dot color film layer is prevented. Therefore, in the embodiment of the disclosure, the light conversion structure is arranged between the side wall of the black matrix and the side wall of the quantum dot color film layer, the quantum dot color film layer can be cured more fully, the problem of uneven UV curing of the quantum dot color film layer is solved, and thus the light-emitting performance of a display device is improved.

Obviously, those skilled in the art can make various modifications and variations to the disclosure without departing from the spirit and scope of the disclosure. In this way, if these modifications and variations of the disclosure fall within the scope of the claims of the disclosure and equivalent technologies thereof, the disclosure is also intended to include these modifications and variations.

What is claimed is:

1. A color film substrate, comprising:
   a base substrate;
   a black matrix, disposed on a side of the base substrate, and having a plurality of pixel openings;
   a quantum dot color film layer, located in the pixel openings, and comprising an ultraviolet curable quantum dot material; and
   a light conversion structure, located between a side wall of the black matrix in the plurality of pixel openings and a side wall of the quantum dot color film layer, and configured to convert ultraviolet light of a first wavelength into ultraviolet light of a second wavelength, wherein the first wavelength is greater than the second wavelength.

2. The color film substrate according to claim 1, wherein the first wavelength is less than 400 nm.

3. The color film substrate according to claim 1, wherein a cross section of the light conversion structure in a direction parallel to a surface of the base substrate has a preset width, and in a direction from a surface of the light conversion structure away from the base substrate to a surface close to the base substrate, the preset width is same.

4. The color film substrate according to claim 1, wherein a cross section of the light conversion structure in a direction parallel to a surface of the base substrate has a preset width, and in a direction from a surface of the light conversion structure away from the base substrate to a surface close to the base substrate, the preset width is gradually increased.

5. The color film substrate according to claim 1, wherein in a direction parallel to a surface of the base substrate, a width of a surface of the black matrix away from the base substrate is less than a width of a surface close to the base substrate.

6. The color film substrate according to claim 1, wherein the light conversion structure comprises scattering particles.

7. The color film substrate according to claim 1, wherein the light conversion structure comprises a base body, and an upconversion luminescent material doped in the base body; wherein
   a material of the base body is photoresist; and
   the upconversion luminescent material comprises one or a combination of Sc-sulfate, Y-sulfate, La-sulfate, Gd-sulfate or Lu-sulfate, and an activator.

8. The color film substrate according to claim 7, wherein the activator comprises one or a combination of $Bi^{3+}$, $Pr^{3+}$ or $Nd^{3+}$, and a mass of the activator accounts for 0.1%-10% of a mass of the upconversion luminescent material.

9. A display apparatus, comprising a display substrate, and a color film substrate disposed on a light emitting side of the display substrate, wherein the color film substrate is the color film substrate according to claim 1.

10. The display apparatus according to claim 9, wherein the display substrate comprises a reflective layer, a backlight module, a protective layer, a first polarizer, a drive substrate, a liquid crystal layer, a second polarizer and an encapsulation layer disposed sequentially in a stacked manner;
    wherein the encapsulation layer is in contact with the black matrix, the quantum dot color film layer and the light conversion structure.

11. The display apparatus according to claim 9, wherein the display substrate comprises a drive substrate, a plurality of mini-LEDs disposed on the drive substrate, a planarization layer disposed on a side of the mini-LEDs facing away from the drive substrate, and an encapsulation layer disposed on a side of the planarization layer facing away from the drive substrate;
    wherein the encapsulation layer is in contact with the black matrix, the quantum dot color film layer and the light conversion structure.

12. The display apparatus according to claim 9, wherein the display substrate comprises a drive substrate, an anode, an organic light emitting layer, a cathode and an encapsulation layer disposed sequentially in a stacked manner;
    wherein the encapsulation layer is in contact with the black matrix, the quantum dot color film layer and the light conversion structure.

13. A fabrication method of the color film substrate according to claim 1, comprising:
- forming the black matrix having the plurality of pixel openings on the base substrate;
- forming the light conversion structure attached to a side wall of the black matrix in the pixel openings;
- performing spin coating or ink-jet printing of the quantum dot mixed solution comprising the ultraviolet curable quantum dot material in the pixel openings having the light conversion structure; and
- forming the quantum dot color film layer by performing ultraviolet light irradiation on the quantum dot mixed solution using the ultraviolet light of the first wavelength.

14. The fabrication method according to claim 13, wherein ultraviolet light of the first wavelength less than 400 nm is adopted to perform ultraviolet light irradiation on the quantum dot mixed solution.

15. The fabrication method according to claim 13, wherein the forming the light conversion structure attached to the side wall of the black matrix in the pixel openings, comprises:
- coating a photoresist doped with an upconversion luminescent material on a side of the black matrix facing away from the base substrate; and
- performing exposure and development on the photoresist, to form the light conversion structure attached to the side wall of the black matrix in the pixel openings.

* * * * *

UNITED STATES PATENT AND TRADEMARK OFFICE
CERTIFICATE OF CORRECTION

| | |
|---|---|
| PATENT NO. | : 12,203,020 B2 |
| APPLICATION NO. | : 17/921069 |
| DATED | : January 21, 2025 |
| INVENTOR(S) | : Qian Sun et al. |

It is certified that error appears in the above-identified patent and that said Letters Patent is hereby corrected as shown below:

On the Title Page

Item (30) should read:
Foreign Application Priority Data
Jun. 10, 2020 (CN).......................202010525111.X Signed and Sealed this
Fourth Day of March, 2025

Coke Morgan Stewart
*Acting Director of the United States Patent and Trademark Office*